United States Patent [19]

Murakami et al.

[11] Patent Number: 5,394,022
[45] Date of Patent: Feb. 28, 1995

[54] PULSE WIDTH MODULATION CIRCUIT APPARATUS

[75] Inventors: Daisuke Murakami; Hideki Yoshida, both of Kanagawa, Japan

[73] Assignee: Sony Corporation, Japan

[21] Appl. No.: 998,687

[22] Filed: Dec. 30, 1992

[30] Foreign Application Priority Data

Jan. 8, 1992 [JP] Japan .................. 4-020540

[51] Int. Cl.6 ............ H03K 5/159; H03K 5/04; H03K 5/13
[52] U.S. Cl. .............. 327/176; 327/278; 327/141; 327/270; 327/261
[58] Field of Search ............ 307/265, 269, 595, 602, 307/603, 605, 606, 608, 597; 328/55, 63, 66, 72, 58

[56] References Cited

U.S. PATENT DOCUMENTS

| 4,600,846 | 7/1986 | Burrows | 307/445 |
| 4,797,586 | 1/1989 | Traa | 307/608 |
| 5,144,174 | 9/1992 | Murakami | 307/608 |
| 5,191,234 | 3/1993 | Murakami et al. | 307/608 |

Primary Examiner—Timothy P. Callahan
Assistant Examiner—Trong Phan
Attorney, Agent, or Firm—Ronald P. Kananen

[57] ABSTRACT

A pulse width modulation circuit apparatus comprises delay gates, delay circuits and an A/D converter. The delay gates are connected in cascade fashion and delay an input clock signal by the same delay time with each delay gate. The delay circuits are furnished interposingly between the delay gates and derive as their common output the delayed clock signal from the delay gates. Because the number of delay gates through which the input clock signal passes is proportional to the delay time acquired, these components constitute a delay circuit arrangement that offers high levels of linearity. With the delay circuit arrangement in use, any one of the delay circuits constituting part of that arrangement is supplied selectively with an operating current as per the digital output from the A/D converter. This provides a delayed clock signal whose delay time matches the level of the input analog signal. Thus there is generated a pulse signal whose pulse width corresponds to the period from the time the input clock signal is given until the delayed clock signal is acquired. This pulse signal has a pulse width of excellent linearity corresponding to the level of the input analog signal.

10 Claims, 5 Drawing Sheets

PULSE WIDTH MODULATION CIRCUIT APPARATUS

BACKGROUND OF THE INVENTION:

1. Field of the Invention

The present invention relates to a pulse width modulation (PWM) circuit apparatus for converting analog signals to pulse widths (time widths).

2. Description of the Prior Art

A majority of conventional PWM circuits are known to contain a comparator, as illustrated in FIG. 1. In the circuit of FIG. 1, the non-inverting (+) and inverting (−) input terminals of the comparator 1 are fed with a sine wave voltage $e_{i+}$ and a triangular wave voltage $e_{i-}$, respectively.

Suppose that the frequency of the triangular wave is sufficiently higher than that of the sine wave and that the amplitude of the triangular wave is greater than that of the sine wave. In that case, the output voltage $e_0$ of a comparator 1 takes on the waveform such as one contained in the timing chart of FIG. 2. As indicated, the period during which the output voltage $e_0$ is High, i.e., the pulse width $\tau$ of the $e_0$ output, is in proportion to the magnitude of the sine wave voltage $e_{i+}$.

One disadvantage of the prior art PWM circuit apparatus utilizing the triangular wave voltage is that because of the inherent constraints on the precision of vertexes and on the linearity of inclinations associated with the triangular wave, there necessarily exist limits to improving the input level vs. pulse width characteristic in terms of linearity.

OBJECTS AND SUMMARY OF THE INVENTION

It is therefore an object of the present invention to provide a PWM circuit apparatus that offers high levels of linearity in the input level vs. pulse width characteristic thereof.

It is another object of the invention to provide a PWM circuit apparatus that matches its maximum pulse width with a clock signal.

In carrying out the invention and according to one aspect thereof, there is provided a pulse width modulation circuit apparatus comprising: an analog-to-digital converter for converting an input analog signal to a digital format for an output; a plurality of delay gates connected in cascade fashion, each of the gates delaying an input clock signal by the same delay time; a plurality of delay circuits provided interposingly between the plurality of delay gates, the delay circuits deriving as the common output thereof the delayed clock signal from the plurality of delay gates delaying the input clock signal; a plurality of signal output circuits connected to the plurality of delay circuits; a switch circuit for selecting any one of the signal output circuits in accordance with the digital output from the analog-to-digital converter; and a pulse generation circuit for generating a pulse signal of which the pulse width corresponds to the period from the time the input clock signal is given until the delayed clock signal is acquired.

According to another aspect of the invention, there is provided a pulse width modulation circuit apparatus comprising: an analog-to-digital converter for converting an input analog signal to a digital format for an output; a plurality of delay gates connected in cascade fashion, each of the gates delaying an input clock signal by the same delay time; a plurality of delay circuits provided interposingly between the plurality of delay gates, the delay circuits deriving as the common output thereof the delayed clock signal from the plurality of delay gates delaying the input clock signal; a plurality of signal output circuits connected to the plurality of delay circuits; a switch circuit for selecting any one of the signal output circuits in accordance with the digital output from the analog-to-digital converter; a pulse generation circuit for generating a pulse signal of which the pulse width corresponds to the period from the time the input clock signal is given until the delayed clock signal is acquired; logic operator for logically operating on the input clock signal in accordance with the output signal from the plurality of delay gates; and a controller for controlling the amount of delay of the plurality of delay gates by integrating the output signal from the logic operator.

According to a further aspect of the invention, there is provided a pulse width modulation circuit apparatus comprising: an analog-to-digital converter for converting an input analog signal to a digital format for an output; a plurality of delay gates connected in cascade fashion, each of the gates delaying an input clock signal by the same delay time; a plurality of delay circuits provided interposingly between the plurality of delay gates, the delay circuits deriving as the common output thereof the delayed clock signal from the plurality of delay gates delaying the input clock signal; a plurality of signal output circuits connected to the plurality of delay circuits; a switch circuit for selecting any one of the signal output circuits in accordance with the digital output from the analog-to-digital converter; a pulse generation circuit for generating a pulse signal of which the pulse width corresponds to the period from the time the input clock signal is given until the delayed clock signal is acquired; a dividing circuit for dividing the input clock signal; a flip-flop circuit for receiving the output signal from the plurality of delay gates and the output signal from the dividing circuit; logic operator for logically operating on the output signal from the dividing circuit and on the output signal from the flip-flop circuit after receipt of the signals; and a filter for receiving and filtering the output signal from the logic operator before sending the filtered result to the plurality of delay gates.

As outlined, the multiple delay gates in cascade connection delay the input clock signal by the same delay time each. The delay circuits furnished interposingly between the delay gates derive as their common output the delayed clock signal from the delay gates delaying the input clock signal. Because the number of delay gates through which the input clock signal passes is proportional to the delay time acquired, these components together with their functions constitute a delay circuit arrangement that offers high levels of linearity.

With the above delay circuit arrangement in use, any one of the delay circuits constituting part of that arrangement is supplied selectively with an operating current in accordance with the digital output from the analog-to-digital converter. This provides a delayed clock signal whose delay time matches the level of the input analog signal. Then there is generated a pulse signal whose pulse width corresponds to the period from the time the input clock signal is given until the delayed clock signal is acquired. This pulse signal has a pulse width of excellent linearity corresponding to the level of the input analog signal.

These and other objects, features and advantages of the invention will become more apparent upon a reading of the following description and appended drawings.

DETAILED DESCRIPTION OF THE PREFERRED EMBODIMENTS

Preferred embodiments of the invention will now be described with reference to the accompanying drawings.

Figure 1:
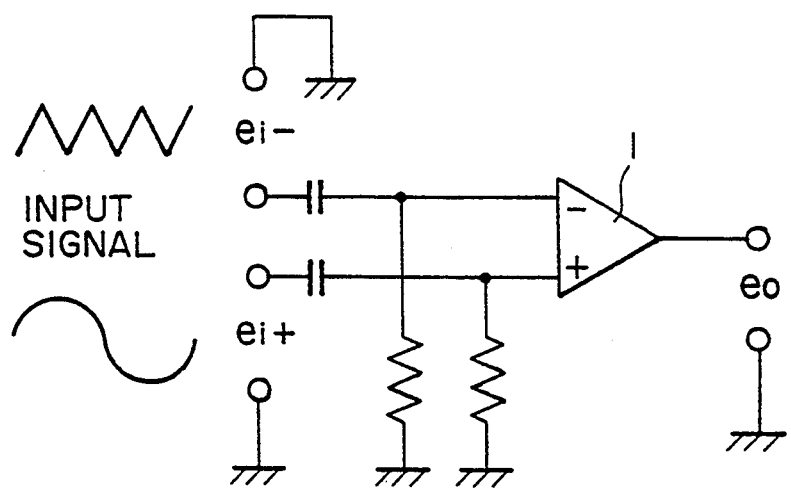
FIG. 1 is a circuit diagram of a typical prior art pulse width modulation (PWM) circuit.
Figure 2:
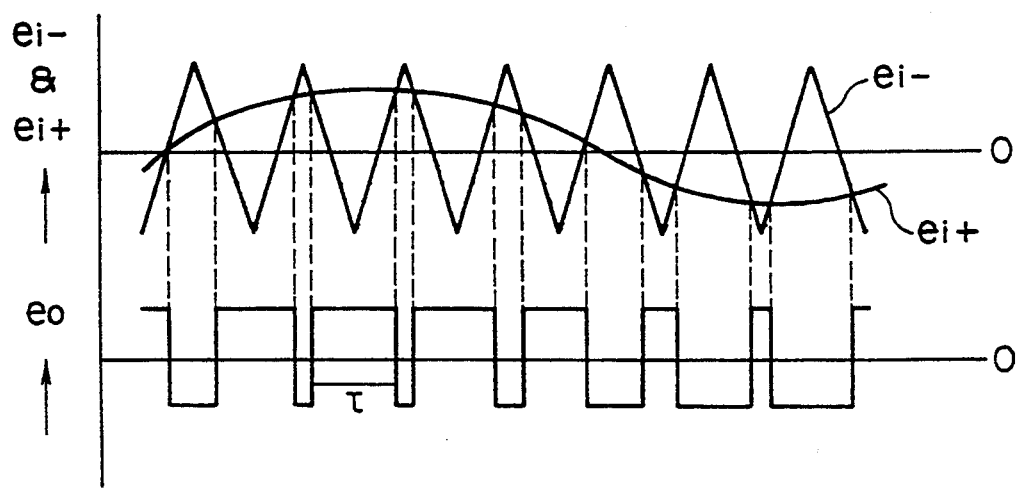
FIG. 2 is a timing chart describing how the prior art PWM circuit works.
Figure 3:
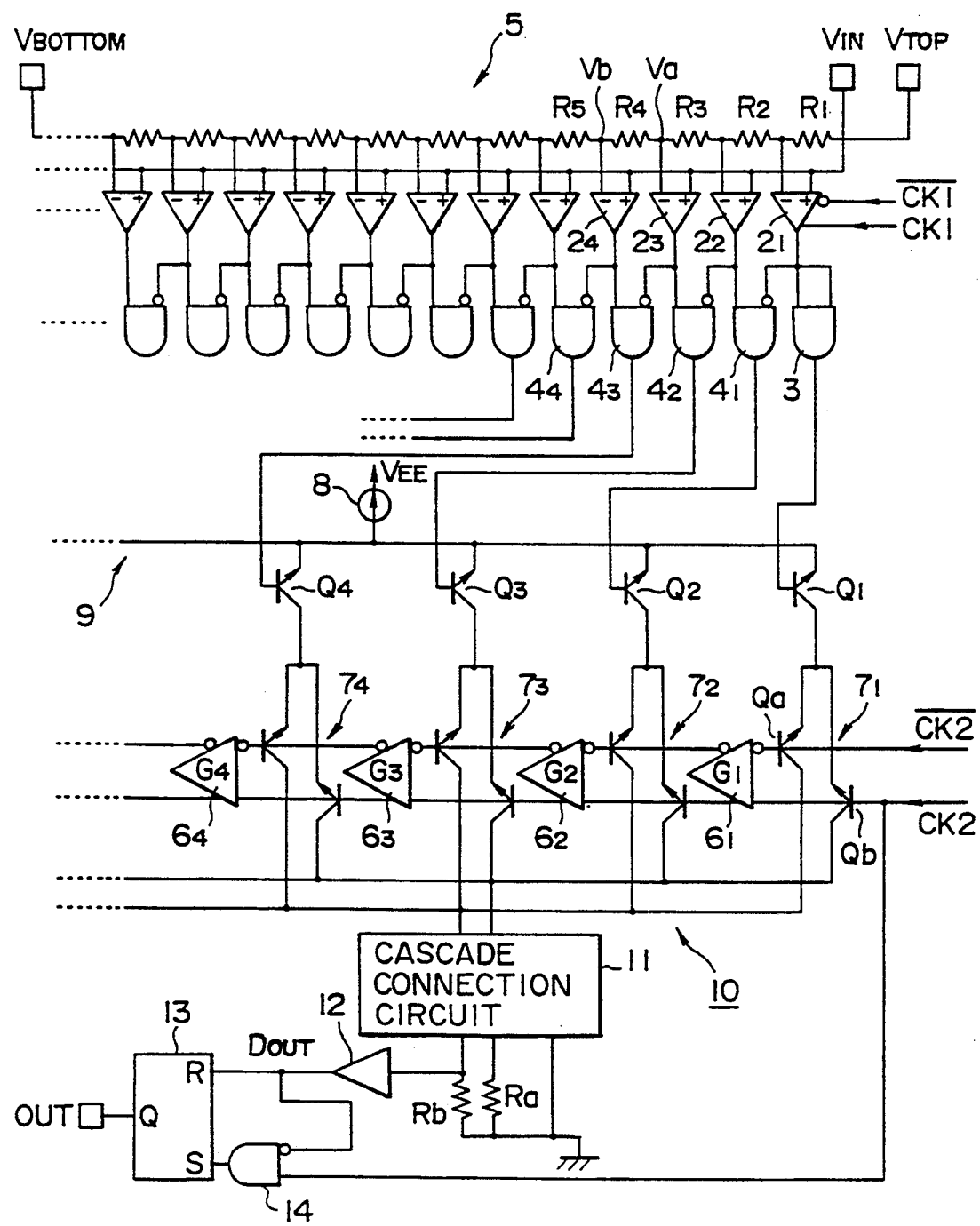
FIG. 3 is a block diagram of a PWM circuit practiced as a first embodiment of the invention.

FIG. 3 is a block diagram of a PWM circuit practiced as the first embodiment of the invention. In FIG. 3, $(2^N-1)$ comparators $2_1$, $2_2$, and so forth are provided for a resolution level of N bits. A total of $2^N$ resistors $R_1$, $R_2$, and so forth each having the same resistance value are connected in series between two power sources $V_{TOP}$ (e.g., 0 V) and $V_{BOTTOM}$ (e.g., −2 V). The voltage levels divided by these resistors are fed to the inverting input terminals (−) of the comparators $2_1$, $2_2$, and so forth as the reference voltage for comparison. The non-inverting input terminals (+) of the comparators $2_1$, $2_2$, and so forth are supplied commonly with an analog input voltage $V_{IN}$.

The comparators $2_1$, $2_2$, and so forth are also fed with a clock signal CK1 and its inverted version as the sampling clock signal. The output of the first comparator $2_1$ provides two inputs to an AND gate circuit 3 and one input to an AND gate circuit $4_1$. The output of the second comparator $2_2$ serves as the other input to the AND gate circuit $4_1$ as well as one input to an AND gate circuit $4_2$. The output of each of the third and subsequent comparators $2_3$, $2_4$, and so forth likewise serves as the input to every two contiguous AND gate circuits. These components constitute a parallel comparison type analog-to-digital (A/D) converter 5.

There are provided $2^N$ delay gates $6_1$, $6_2$, and so forth having the same delay time each and connected in cascade fashion. The delay gates $6_1$, $6_2$, and so forth receive a clock signal CK2 and its inverted version, the clock signal CK2 having a pulse width sufficiently smaller than that of the clock signal CK1 and in synchronism therewith. Between the delay gates $6_1$, $6_2$, and so forth are a plurality of differential amplifiers (delay circuits) $7_1$, $7_2$, and so forth that derive as their common output the delayed clock signal from the delay gates.

The differential amplifiers $7_1$, $7_2$, and so forth are each composed of a pair of differential transistors Qa and Qb whose emitters are commonly connected and whose bases receive the clock signal CK2 and its inverted version. Between the common connecting points of the emitters and a common constant current source 8 are switching transistors $Q_1$, $Q_2$, and so forth constituting a current switch circuit 9. The current switch circuit 9 selectively supplies an operating current to any one of the differential amplifiers. These components make up a delay circuit arrangement 10 that delays the clock signal CK2 in units of the delay time allotted to each delay gate.

In the delay circuit arrangement 10, the clock signal CK2 is initially input to the first delay gate ($G_1$) $6_1$ that delays the signal by a predetermined unit delay time. The clock signal CPK2 thus delayed is sent to the second delay gate ($G_2$) $6_2$. In this manner, the timing at which the clock signal CK2 is derived from the second differential amplifier $7_2$ is delayed by the delay time allotted to one delay gate. The clock signal CK2 input to the second delay gate $6_2$ is further delayed by the delay gate $6_2$ by the predetermined delay time before being sent to the third delay gate ($G_3$) $6_3$.

The clock signal CK2 passing through the delay gates $6_1$, $6_2$, and so forth is taken out of the delay circuit arrangement 10 by that one of the differential amplifiers 7 which is activated by selective application of the operating current from the current switch circuit 9. The current switch circuit 9, for its part, supplies one of the differential amplifiers $7_1$, $7_2$, etc. with the operating current in accordance with the digital output from the AND gate 3 and from any one of the NAND gate circuits $4_1$, $4_2$, and so forth.

The delayed clock signal taken out of the delay circuit arrangement 10 is fed to a cascade connection circuit 11. This turns on or off the pair of differential transistors constituting the cascade connection circuit 11. Between the collectors of these differential transistors on the one hand, and the ground on the other, are load resistors Ra and Rb. The voltage of the High level derived as the output from one of the collectors is used as the delayed clock signal $D_{OUT}$.

The delayed clock signal $D_{OUT}$ is sent both to the reset (R) input of an RS flip-flop circuit 13 and to one of the two inputs of an AND gate circuit 14. The other input of the AND gate circuit 14 receives the clock signal CK2. The output of the exclusive-OR gate circuit 14 is fed to the set (S) input of the RS flip-flop circuit 13. The RS flip-flop circuit 13 and the AND gate circuit 14 constitute a pulse generation circuit that generates a pulse signal whose pulse width corresponds to the period from the time the clock signal CK2 is given until the delayed clock signal $D_{OUT}$ is acquired.

Figure 4:
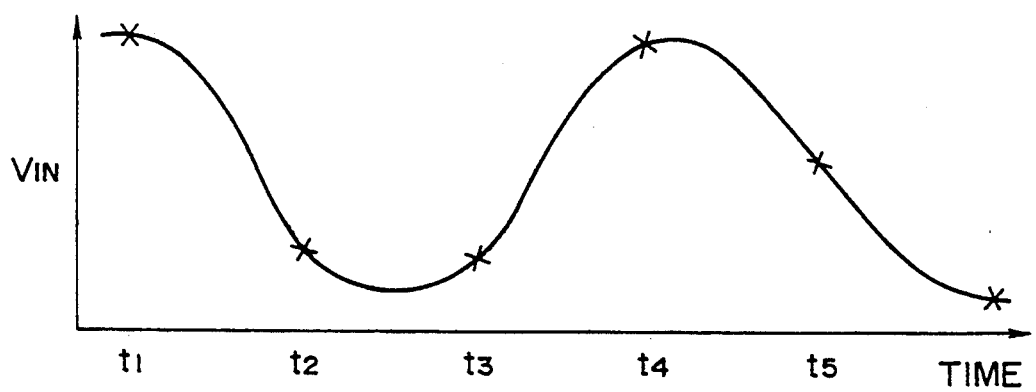
FIGS. 4 and 5 are timing charts depicting how the first embodiment of FIG. 3 works.
Figure 5:
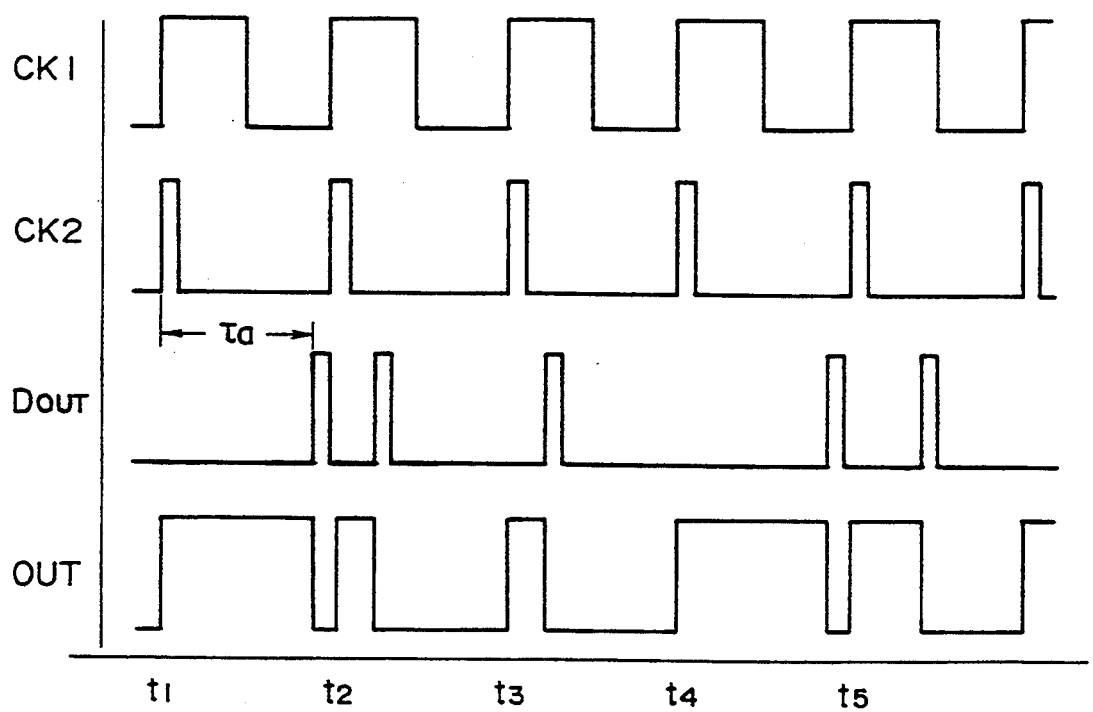

How the PWM circuit of the above constitution works will now be described with reference to the timing chart of FIG. 4. In the example of FIG. 4, the input analog voltage $V_{IN}$ is sampled illustratively at point a by the clock signal CK1 which is a sampling pulse signal.

In this example, the input analog voltage VIN, at the level of point a, is assumed to fall between the divided voltage level Va across the resistors $R_3$ to $R_4$ on the one hand, and the divided voltage level Vb across the resistors $R_4$ to $R_5$ on the other. In this setup, each output from the comparators $2_1$, $2_2$ and $2_3$ goes Low and each output from the comparator $2_4$ and subsequent comparators goes High. As a result, only the output of the AND gate circuit $4_3$ is driven High, with the remaining outputs brought Low. These levels constitute digital information that is derived as a digital output from the A/D converter 5.

Supplying the digital output of the A/D converter 5 to the current switch circuit 9 turns on the switching transistor $Q_4$ alone. This connects the differential amplifier $7_4$ alone to the constant current source 8 for operation. In this manner, the clock signal CK2 delayed by the delay gates $6_1$, $6_2$ and $6_3$ by their respective delay times is taken out through the differential amplifier $7_4$. The clock signal CK2 thus derived passes through the cascade connection circuit 11 and output amplifier 12 to become the delayed clock signal $D_{OUT}$. If each delay time of the delay gates $6_1$, $6_2$, and so forth is represented by $\tau_0$, the delay time $\tau_a$ of the delayed clock signal $D_{OUT}$ relative to the clock signal CK2 is given as $3\tau_0$.

Meanwhile, the RS flip-flop circuit 13 is set at a leading edge of the clock signal CK2 and reset when the delayed clock signal $D_{OUT}$ is output. Thus a pulse signal OUT is obtained, with its pulse width corresponding to the delay time $\tau_a$ from the time the clock signal CK2 is given until the delayed clock signal $D_{OUT}$ is acquired. The pulse signal OUT is derived as time width information that is proportional to the level of the input analog voltage $V_{IN}$.

As described, the first embodiment of the invention comprises the A/D converter that converts the input analog signal to a digital format and the delay circuit arrangement that offers excellent linearity by having the number of delay gates through which the input clock signal passes held in proportion to the delay time obtained. In this constitution, the first embodiment acquires a clock signal delayed by the delay time corresponding to the level of the input analog signal, and furnishes a pulse signal whose pulse width corresponds to the delay time from the time the input clock signal is given until the delayed clock signal is obtained. Thus the invention provides a pulse signal with high levels of linearity matching the level of the analog signal.

The second embodiment of the invention will now be described with reference to the accompanying drawings. Reference resistors $R_{11}$, $R_{12}$, and so forth of the A/D converter in the second embodiment of FIG. 6 correspond respectively to the resistors $R_1$, $R_2$, and so forth in the first embodiment of FIG. 3. Likewise, comparators $21_1$, $21_2$, and so forth correspond respectively to the comparators $2_1$, $2_2$, and so forth; an AND circuit 20 corresponds to the AND circuit 3; AND circuits $23_1$, $23_2$, and so forth correspond respectively to the AND circuits $4_1$, $4_2$; current switch transistors $Q_{11}$, $Q_{12}$, and so forth, in current switch circuit 28 correspond respectively to the switching transistors $Q_1$, $Q_2$, and so forth, in current switch circuit 9; the differential amplifiers $26_1$, $26_2$, and so forth correspond respectively to the differential amplifiers $7_1$, $7_2$, and so forth; and delay gates $G_{11}$, $G_{12}$, and so forth, in delay circuit arrangement 29 correspond respectively to the delay gates $G_1$, $G_2$, and so forth. In addition, a cascade connection circuit 30 for deriving a delay signal from the differential amplifiers in FIG. 6 corresponds to the cascade connection circuit 11 of FIG. 3; an output amplifier 31 receiving its load from the cascade connection circuit 30 corresponds to the output amplifier 12; an AND circuit 33 corresponds to the AND circuit 14; and an RS flip-flop circuit 32 corresponds to the RS flip-flop circuit 13, the circuit 32 receiving the output from the output amplifier 31 and the output signal from the AND circuit 33, the logical output of the circuit 32 being output via its OUT terminal. The operational flow up to this point is the same between the first and the second embodiments.

It should be noted that the first embodiment requires matching its maximum pulse width against one period of the clock signal CK1. This is because performance is the highest when the full range of the A/D converter reaches the maximum pulse width. In the first embodiment, the full range of the input signal to the A/D converter is independent of the pulse width. For example, it may happen that process-related dispersion or other irregularities prevent the pulse width from arriving at its maximum even in full range, with High and Low levels coexisting within a single clock period. It may also happen that a sufficiently large delay caused by the delay gates $G_1$, $G_2$, and so forth brings the output pulse width to its maximum even if the digital output of the A/D converter is yet to be maximized, with the result that a High level pulse occurs within a single clock period. These disadvantages are circumvented by the second embodiment in which a clock source $CK2_1$ supplies a clock signal A to a ½ divider 34. After the input signal is divided by the ½ divider 34, the output of the divider is sent to a D flip-flop circuit 35. The clock input B to the D flip-flop 35 takes an output signal B from the delay gate located centrally among the gates $G_{11}$, $G_{12}$, and so forth connected in cascade fashion. The output signal B is fed to the D flip-flop circuit 35 as its synchronizing clock signal.

Figure 6:
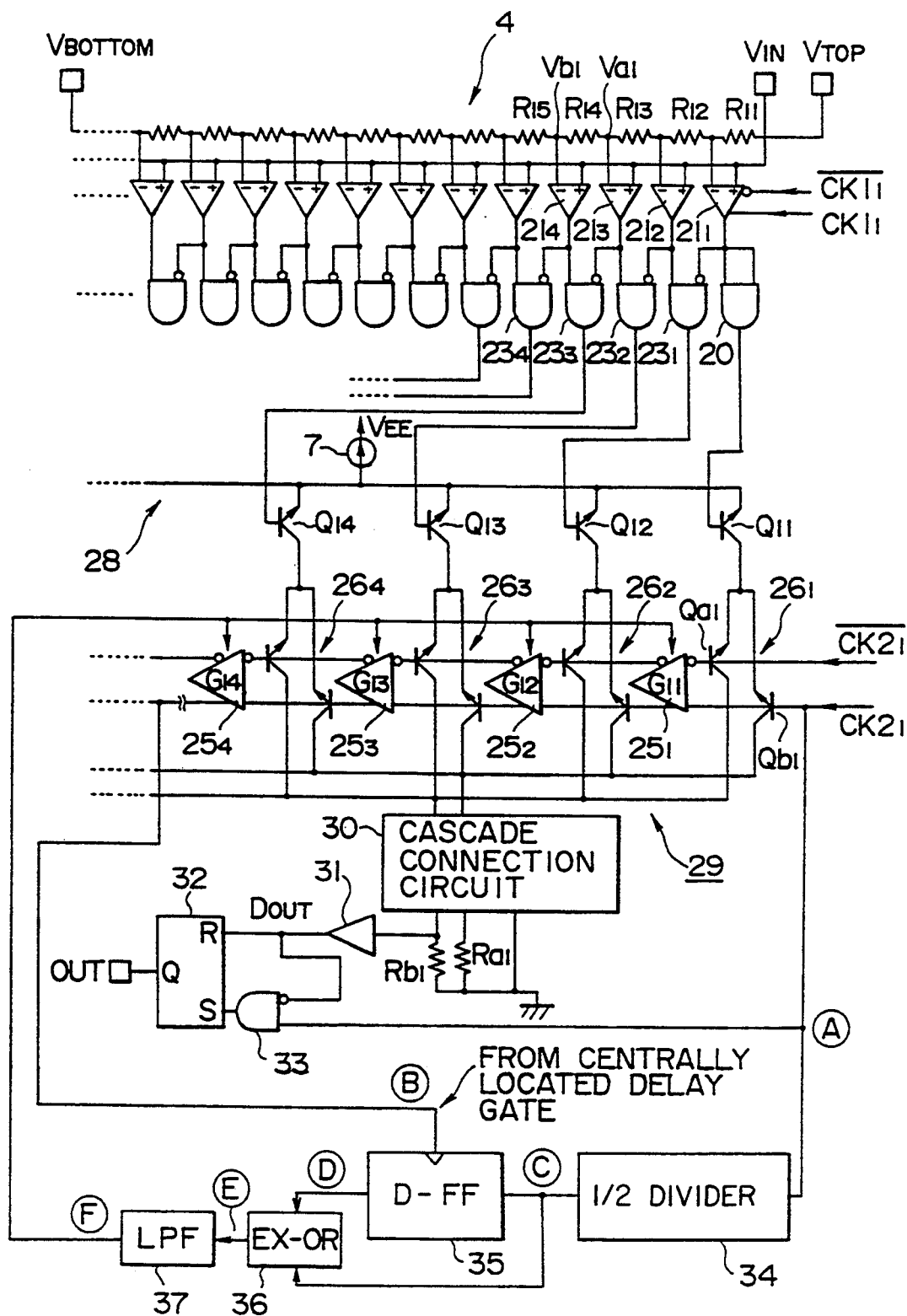
FIG. 6 is a block diagram of a PWM circuit practiced as second embodiment of the invention.

The output signal D of the D flip-flop circuit 35 and the output signal C of the ½ divider 34 are input to an exclusive-OR circuit 36. The result E of the operation by the exclusive-OR circuit 36 is sent to a low-pass filter (LPF) 37 located downstream. The output signal F of the LPF 37 is supplied to the base of a current source transistor attached to each of the delay gates $G_{11}$, $G_{12}$, and so forth for controlling over the delay times thereof. The operation of the above second embodiment of FIG. 6 is described with reference to the timing waveforms of FIGS. 8(A)–(E).

Figure 7:
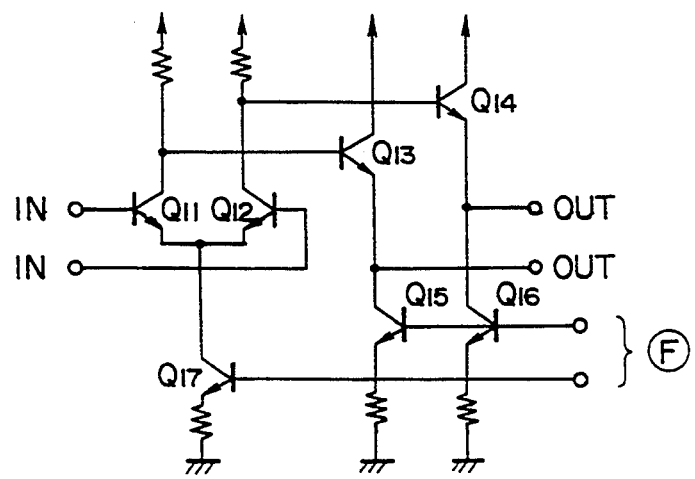
FIG. 7 is a circuit diagram of a delay circuit arrangement for use in the second embodiment of FIG. 6.
Figure 8:
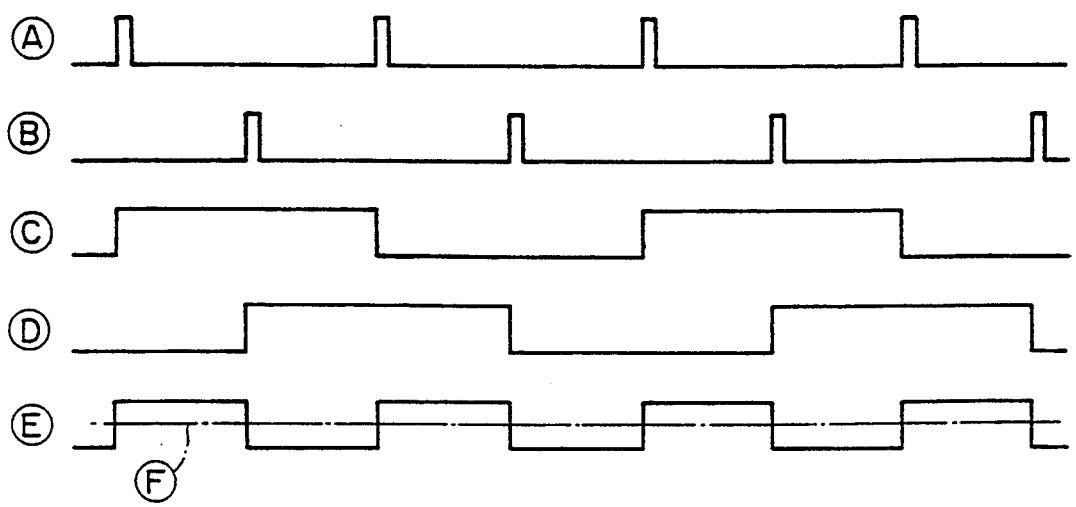
FIGS. 8(A)–(E) are timing waveforms applicable to the second embodiment as it operates.

FIG. 7 illustrates a typical delay circuit arrangement together with a current source setup as a part thereof in the second embodiment. The transistors $Q_{11}$ and $Q_{12}$ constitute a differential amplifier. The bases of the transistors receive the output signal from the preceding delay gate. The collectors are connected to load resistors. The delayed output signal passing through the collectors is taken from the emitters via emitter followers $Q_{13}$ and $Q_{14}$ for transmission to the next delay gate. In this setup, the voltage fed to the bases of transistors $Q_{15}$, $Q_{16}$ and $Q_{17}$ is controlled so as to vary the currents to a transistor $Q_{17}$ acting as the current source for the differential amplifier of the delay gate and to a current source transistor $Q_{15}$ for emitter follower use, as well as to change the amount of delay accordingly.

The above current source transistors $Q_{15}$, $Q_{16}$ and $Q_{17}$ are controlled by use of the output signal F from the LPF 37.

In the second embodiment of the above construction, when the pulse signal B from the delay gate located centrally among the gates $G_{11}$, $G_{12}$, and so forth connected in cascade fashion is delayed, the output D of the D flip-flop circuit 35 is also delayed. This leads to a duty ratio of more than 50% for the output width of the output signal E from the exclusive-OR circuit 36. Having the LPF 37 integrate the signal E raises the voltage value higher than the reference voltage line F of the 50% duty ratio. This in turn boosts the base voltage of the current source transistors of the delay gates, thereby raising the current value. With the delay time of each delay gate thus reduced, the total delay time is also lowered. In this manner, the total delay amount comes to coincide with each clock period.

If the delay time of the pulse signal B is small enough, the output voltage F of the LPF 37 drops below the reference line F. When the reduced voltage is supplied to each base of the current source transistors constituting the delay gates, the collector current drops. As a result of this, the current value of the current source for each delay gate drops. Hence the total delay amount increases and again coincides with each clock period.

As many apparently different embodiments of this invention may be made without departing from the spirit and scope thereof, it is to be understood that the invention is not limited to the specific embodiments thereof except as defined in the appended claims.

What is claimed is:

1. A pulse width modulation circuit apparatus comprising:
   an analog-to-dialog converter for converting an input analog signal to an input digital signal;
   a plurality of delay gates connected in cascade fashion, each of the delay gates delaying an input clock signal by a same delay time;
   a respective plurality of delay circuits provided interposingly between said plurality of delay gates, one of the delay circuits producing as a common output thereof a delayed clock signal from its corresponding delay gate;
   a respective plurality of signal output circuits connected to said plurality of delay circuits;
   a switch circuit for selecting one of said signal output circuits in accordance with the digital input signal from said analog-to-digital converter and for selecting said one delay circuit;
   a pulse generation circuit for generating a pulse signal of which the pulse width corresponds to a period from when said input clock signal is supplied to said delay gates until said delayed clock signal is produced by said one delay circuit;
   logic operation means for logically operating on said input clock signal in accordance with the output signal from said plurality of delay gates; and
   control means for controlling the amount of delay of said plurality of delay gates by integrating the output signal from said logic operation means.

2. A pulse width modulation circuit apparatus comprising:
   an analog-to-digital converter for converting an input analog signal to an input digital signal;
   a plurality of delay gates connected in cascade fashion, each of the gates delaying an input clock signal by a same delay time;
   a respective plurality of delay circuits provided interposingly between said plurality of delay gates, one of the delay circuits producing as a common output thereof a delayed clock signal from its corresponding delay circuit;
   a respective plurality of signal output circuits connected to said plurality of delay circuits;
   a switch circuit for selecting any one of said signal output circuits in accordance with the digital input signal from said analog-to-digital converter and for selecting said one delay circuit;
   a pulse generation circuit for generating a pulse signal of which the pulse width corresponds to a period from when said input clock signal is supplied to said delay gates until said delayed clock signal is produced by said one delay circuit;
   a dividing circuit for dividing a frequency of said input clock signal;
   a flip-flop circuit for receiving an output signal from a predetermined delay gate out of said plurality of delay gates and a frequency divided output signal from said dividing circuit;
   logic operation means for logically operating on the frequency divided output signal from said dividing circuit and on the output signal from said flip-flop circuit ; and
   a filter for receiving and filtering an output signal from said logic operation means and for sending the filtered result to said plurality of delay gates for adjusting the delay time of said delay gates.

3. A pulse width modulation circuit apparatus according to claim 2, wherein said flip-flop circuit is a D flip-flop circuit.

4. A pulse width modulation circuit apparatus according to claim 2, wherein said dividing circuit is a ½ dividing circuit.

5. A pulse width modulation circuit apparatus according to claim 2, wherein said filter is a low-pass filter.

6. A pulse width modulation circuit apparatus according to claim 2, wherein the output signal supplied to said flip-flop circuit from said predetermined delay gate is taken from a centrally located delay gate within said plurality of delay gates.

7. A pulse width modulation circuit apparatus comprising:
   an analog-to-dialog converter for converting an input analog signal to an input digital signal;
   a plurality of delay gates connected in cascade fashion, each of the delay gates delaying an input clock signal by a same delay time;
   a respective plurality of delay circuits provided interposingly between said plurality of delay gates, one of the delay circuits producing as a common output thereof a delayed clock signal from its corresponding delay gate;
   a respective plurality of signal output circuits connected to said plurality of delay circuits;
   a switch circuit for selecting one of said signal output circuits in accordance with the digital input signal from said analog-to-digital converter and for selecting said one delay circuit; and
   a pulse generation circuit for generating a pulse signal of which the pulse width corresponds to a period from when said input clock signal is supplied to said delay gates until said delayed clock signal is produced by said one delay circuit;
   wherein said pulse width of said pulse signal varies in proportion to a magnitude of said input analog signal.

8. The pulse width modulation circuit as set forth in claim 7, wherein each of said delay circuits comprises a differential amplifier.

9. The pulse width modulation circuit as set forth in claim 7, wherein said switch circuit comprises a plurality of exclusive-OR gates with each exclusive-OR gate receiving a respective bit from said digital input signal and an adjacent bit.

10. The pulse width modulation circuit as set forth in claim 7, wherein said pulse generation circuit comprises a RS flip-flop being set by said input clock signal and being reset by said delayed clock signal.

* * * * *